US011807402B2

(12) United States Patent
Sherman (10) Patent No.: US 11,807,402 B2
(45) Date of Patent: **\*Nov. 7, 2023**

(54) ORBIT DETERMINATION SERVICE

(71) Applicant: Amazon Technologies, Inc., Seattle, WA (US)

(72) Inventor: Ryan M. Sherman, Washington, DC (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/929,624

(22) Filed: Sep. 2, 2022

(65) Prior Publication Data

US 2023/0174251 A1     Jun. 8, 2023

Related U.S. Application Data

(63) Continuation of application No. 16/799,629, filed on Feb. 24, 2020, now Pat. No. 11,447,273.

(51) Int. Cl.
| | |
|---|---|
| *B64G 1/24* | (2006.01) |
| *B64G 3/00* | (2006.01) |
| *G06F 30/15* | (2020.01) |
| *H04B 7/185* | (2006.01) |

(52) U.S. Cl.
CPC .............. *B64G 1/242* (2013.01); *B64G 3/00* (2013.01); *G06F 30/15* (2020.01); *H04B 7/18508* (2013.01); *H04B 7/18513* (2013.01); *H04B 7/18517* (2013.01)

(58) Field of Classification Search
None
See application file for complete search history.

(56) References Cited

U.S. PATENT DOCUMENTS

| | | |
|---|---|---|
| 2011/0234456 A1 | 9/2011 | McBurney et al. |
| 2014/0132447 A1 | 5/2014 | Derbez et al. |
| 2015/0070211 A1 | 3/2015 | Cheng et al. |
| 2018/0210090 A1* | 7/2018 | Soualle .................. G01S 19/40 |

\* cited by examiner

*Primary Examiner* — Christine T Duong
(74) *Attorney, Agent, or Firm* — Alexander A. Knapp; Kowert, Hood, Munyon, Rankin & Goetzel, P.C (57) ABSTRACT

Instead of users (e.g., independent owners/operators of different satellites) having to calculate orbit determination for each satellite themselves, an orbit determination service automatically calculates the orbit determination (OD) based on a user request. The calculated OD can then be used by a satellite ground station service to determine appropriate orientations for a ground station antenna in order to communicate with the satellite. In some embodiments, the OD service uses information from the calculations of ODs for multiple satellites and users to update a model used in the OD calculation, for example, to provide a more accurate model for Earth's atmosphere to be applied in subsequent OD calculations. In some embodiments, the OD service uses a user-provided computer-aided drawing (CAD) file of the satellite to produce or tune models specific to the satellite, for example, to generate more accurate models for solar radiation pressure and ballistic drag.

20 Claims, 6 Drawing Sheets

ORBIT DETERMINATION SERVICE

This application is a continuation of U.S. patent application Ser. No. 16/799,629, filed Feb. 24, 2020, which is hereby incorporated by reference herein in its entirety.

BACKGROUND

Satellites are increasingly employed by various independently operating entities (e.g., businesses, universities, or governments) for applications such as weather, surface imaging, communications, data transmission, space measurements, geosynchronous positioning, etc. In many examples, the owner or operator of the satellite is primarily concerned with the payload operation (e.g., the function performed by the satellite), which generally requires establishing a communication link between a satellite ground station and the orbiting satellite for transmission of data therebetween. In order to establish a communication link, the satellite ground station performs acquisition of signal (AoS) based on the location of the satellite in its orbit at a specific time.

The owner or operator of the satellite thus has to provide to the ground station service an orbit determination (OD) for the satellite. OD is the empirical estimation of a satellite's trajectory determined using statistical methods, physical force and acceleration models, and sensor measurements. OD can then be used to produce an accurate ephemerides (e.g., table or data file of calculated satellite positions) and to produce, from the ephemerides, acquisition products (e.g., two-line element (TLE) set that encodes orbital elements, orbit ephemeris message (OEM) that specifies a position and velocity of an object at multiple epochs within a given time range, an improved inter-range vector (IIRV), etc.)

DETAILED DESCRIPTION

Instead of users (e.g., independent owners/operators of different satellites) having to calculate orbit determination (OD) for each satellite (or spacecraft) themselves, an orbit determination service automatically calculates OD based on a user request. The user can provide information of any kind that particularly identifies the satellite, for example, an assigned satellite identifier (e.g., an ID number assigned by a ground station service provider, a tracking or ID number assigned by a governmental agency such as North American Aerospace Defense Command (NORAD) or National Aeronautics and Space Administration (NASA), etc.), point angles (e.g., time and orientation for detection by antenna of a ground station of radio frequency (RF) radiation from the satellite), ranging of the satellite (e.g., Doppler shift of frequency of RF radiation from satellite, 1-way or 2-way radiometric ranging, etc.), global positioning system (GPS) telemetry of a beacon of the satellite, imaging of the satellite (e.g., high-resolution timed exposure of the night sky through which the satellite travels), etc. Based on the last-known best state of the identified satellite, the OD service predicts, with a net uncertainty, a state of the satellite using physics models.

The OD service can then use measurement data to correct the predicted state to yield the requested OD. The measurement data can be provided by the user as part of the initial request, retrieved from third-party operators or databases (e.g., NORAD Space-Track, measurements available in industry, etc.), or obtained by direct measurement via a corresponding satellite ground station service or network of satellite ground stations. For example, the measurement data types may be similar to those used to identify the satellite to the OD service. However, where the user may have otherwise been limited to just their own measurement data for correcting predicted OD, the OD service is able to rely on a larger pool of measurement data for correction, including passive (i.e., not actively obtained for a particular satellite) measurements from third parties as well as measurement data provided by other users to the OD service.

The requested OD can then be used by a satellite ground station service to determine appropriate orientations (e.g., point angles) for a ground station antenna in order to communicate with the satellite. For example, the OD can be converted using conventional procedures to an ephemeris or ephemerides, which in turn can be used to generate acquisition products for antenna orientation in a conventional manner. In some embodiments, the OD service can be integrated with a satellite ground station service, thereby allowing a user of the ground station service to schedule communication between any ground station of the service and the designated satellite without having to separately determine OD or ephemerides for the satellite.

In some embodiments, the OD service can allow for manual correction by a user, thereby enabling the user to "fly their own mission," for example, to take advantage of their own proprietary models, to apply their own proprietary measurement data, to adjust for factors particular to their satellite, or for any other reason. Thus, the OD service can allow the user to modify models or other resource types (e.g., custom tune OD configurations) employed in predicting OD, either before the correction or after the correction. Alternatively or additionally, the user can manually correct the predicted OD, for example, by applying measurement data to collapse the uncertainty in the OD predicted by the OD service or by ignoring measurement data that is physically inconsistent (i.e., violates the laws of physics or is not otherwise compatible with the actual or expected state of the satellite). For example, the user may elect to ignore ranging measurement data affected by unexpected signal reflection or motion of the satellite (e.g., satellite spin), which ranging data would otherwise lead to an erroneous OD if incorporated. In some embodiments, the OD service can learn from these manual user corrections in order to automatically apply corrections, or at least notify users of potential corrections, in subsequent calculation of OD for the same or different users.

In some embodiments, the OD service uses information from calculations of ODs for multiple satellites and/or users to improve an accuracy of a model (e.g., a model for Earth's atmosphere for use in determining drag coefficient of the satellite) used in the OD calculation. The improved model can then be applied in subsequent OD calculations for the same or other users or satellites. For example, information from the OD calculation for multiple satellites can be used by the OD service to iteratively change a model for Earth's atmosphere so as to minimize, or at least reduce, a difference between the corrected OD and the originally predicted OD for each satellite.

In some embodiments, the OD service uses information about the satellite to generate specific models particular to that satellite. For example, the OD service can receive a computer-aided drawing (CAD) file of the satellite (or other data providing information regarding the structure or geometric shape of the satellite) from the user. In some embodiments, the CAD file submission is part of the original OD request from the user. Alternatively or additionally, the CAD file submission may be part of an initial registration of the user with the OD service. The CAD file can be used by the OD service to tailor (e.g., produce or tune) models for use with the satellite, for example, to generate more accurate models for solar radiation pressure and ballistic drag.

Figure 1:
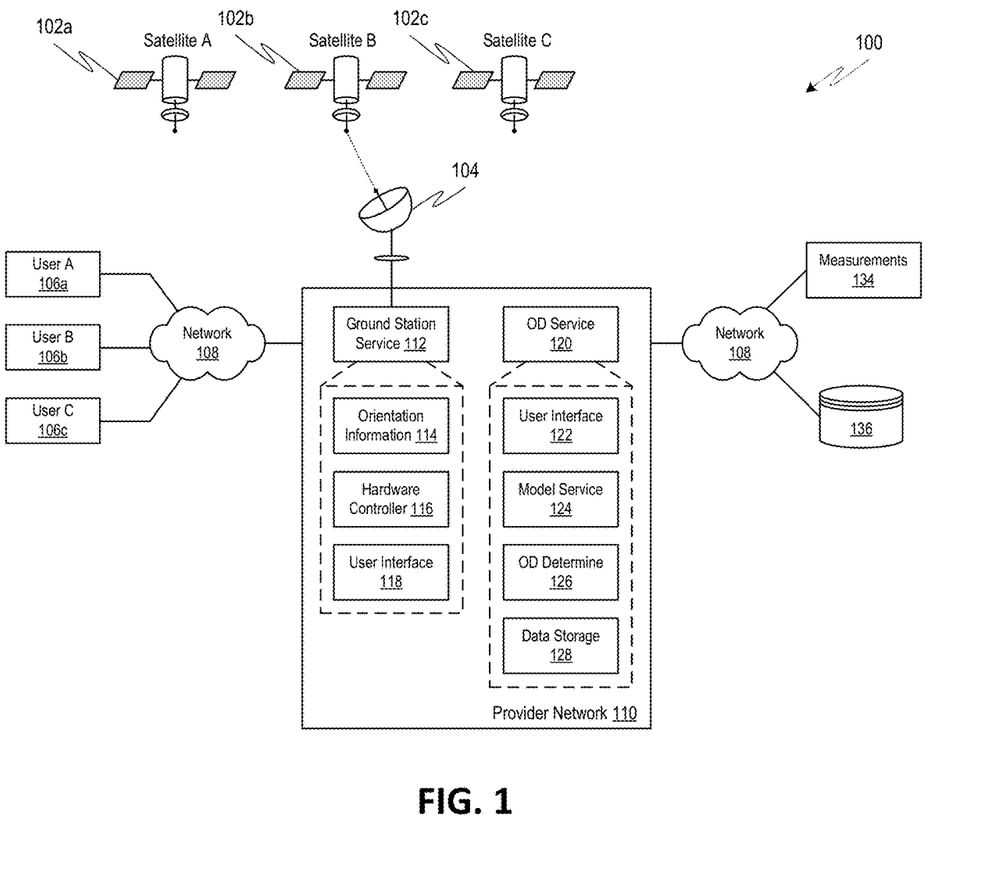
FIG. 1 is a simplified explanatory diagram of a satellite ground station service with orbit determination, according to one or more embodiments of the disclosed subject matter.

Referring to FIG. 1, a network setup 100 for multiple users 106a-106c to communicate with multiple respective satellites 102a-102c via one or more satellite ground stations 104 is shown. Users 106a-106c can be respective owners of satellites 102a-102c, respective operators of satellites 102a-102c, or any other user of ground station service 112 otherwise authorized to have access to satellites 102a-102c. Although three users, three satellites, and a single ground station are shown in FIG. 1, any number of users, satellites, and ground stations is possible, and embodiments are not limited to the illustrated numbers.

Users 106a-106c can communicate via network 108 with ground station service 112 to schedule communication sessions between satellites 102a-102c and ground station 104 and receive data from scheduled communication sessions. Ground station 104 of ground station service 112 can include one or more satellite antennas, software defined radios, and modems to communicate with satellites 102a-102c using radio signals. Based on instructions received from users 106 at ground station service 112 via network 108, the ground station 104 can receive data downlinked from the satellites 102, monitor health and status of satellites 102, and/or provide commands to perform tasks or uplink data to the satellites 102.

Network 108 can include any suitable combination of networking hardware and protocols that establish network-based communications with provider network 110. For example, network 108 can comprise the various telecommunications networks and service providers that collectively implement the Internet. Alternatively or additionally, network 108 can include private networks, such as local area networks (LANs) or wide area networks (WANs), and/or public or private wireless networks. For example, a given user 106a and provider network 102 may each be respectively provisioned within enterprises having their own internal networks. In such an example, network 108 can include hardware and software to establish a networking link between user 106a and the Internet, and between the Internet and provider network 102. In some embodiments, users 106 may communicate with provider network 102 using a direct connection rather than network 108.

Ground station service 112 can be part of provider network 110, which may provide one or more services (such as various types of cloud-based computing or storage) accessible via network 108 to users 106a-106c. For example, provider network 110 may include numerous data centers hosting various resource pools, such as collections of physical and/or virtualized computer servers, storage devices, networking equipment and the like (e.g., as described below with respect to computing environment 400 in FIG. 4), that implement and distribute the infrastructure and services offered by the provider network 110. In some embodiments, provider network 110 can provide computing resources, such as a virtual compute service, data storage service (e.g., block-based storage service or various other storage types, such as object/key-value based data stores or various types of database systems), and/or any other type of network-based service. Users 106a-106c can access the services offered by provider network 110 via network 108. Similarly, the network-based services can communicate with and/or make use of each other to provide different services. For example, computing resources offered to users in units called "instances," such as virtual or physical compute instances or storage instances, may make use of other resources.

In some embodiments, the ground station service 112 can coordinate with an OD service 120, which can also be part of provider network 110, in order to determine orientation of an antenna of the ground station 104 to communicate with a satellite 102 requested by one of the users 106. In particular, the ground station service 112 can request that the OD service 120 calculate and return an OD pertaining to the user-requested satellite. The dotted line box corresponding to ground station service 112 illustrates a logical view of some of services or modules that may be offered by ground station service 112, for example, orientation information determination 114, ground station hardware control 116, and user interface 118. In embodiments, the user interface 118 can be a web-based graphical user interface (GUI) or an application programmatic interface (API), for example, when the user 106 programmatically submits the request. For example, the API of user interface 118 can function as an endpoint that allows programmatic integration of the ground station service 112 into existing satellite operation systems. Orientation information determination module 114 of the ground station service 112 can convert the OD returned by the OD service 120 into an orientation (e.g., point angles) for an antenna of the ground station 104 for communication with the requested satellite. The hardware control module 116 can then translate the orientation into appropriate motor control signals that move the antenna of the ground station 104 to point at the requested satellite for communication therewith.

The dotted line box corresponding to OD service 120 illustrates a logical view of services or modules that may be offered by OD service 120, for example, a user interface 122, a model service 124, an OD determination service 126, and data storage service 128. The OD service 120 can be configured to return an OD solution for one of the satellites 102a-102c based on a client request to user interface 122. For example, the user interface 122 can be a web-based GUI when the client request is directly from one of the users 106a-106c. Alternatively, the user interface 122 can be an API, for example, when the client request is from the ground station service 112 in response to a request from one of the users 106a-106c to ground station service 112 for communication with one of the satellites 102a-102c or when a user 106a-106c programmatically submits a request for OD of one of the satellites 102a-102c. For example, the API of user interface 122 can function as an endpoint that allows programmatic integration of the OD service 120 into existing satellite operation systems.

The data storage service 128 can store therein various data and/or models employed by the OD service 120 in determining an OD. For example, the data storage service 128 can store therein various resource types, such as, but not limited to, those listed in Table 1 below. The data storage service 128 can provide any type of data storage, such as, but not limited to, a block-based storage service that provides block-storage resources to compute instances of a compute service, an object-based storage service that stores data objects, a cold storage service that provides a low-cost storage solution for infrequently accessed data objects, or a database. In an exemplary embodiment, the data storage service 128 can be a cloud-based nonSQL database service, such as Amazon Web Services (AWS) DynamoDB.

TABLE 1

Examples of notional resource types in orbit determination service.

| Resource Type | Attributes | Expiration |
|---|---|---|
| Filter Output | ID<br>Name<br>Previous Filter Output ID<br>Tracking Data IDs<br>Filter Model ID<br>Satellite Model ID<br>Force Model ID<br>Definitive or Predicted<br>Residual Data IDs<br>State Estimate Data IDs<br>Last State Estimate<br>E.g., time, location in 3-dimensions, velocity in 3-dimensions, drag coefficient ($c_d$), radiation pressure coefficient ($c_R$), error covariance, etc. | None |
| Residuals Data | ID<br>Filter Output ID (that produced Residuals)<br>Type<br>E.g., global positioning system (GPS), 1-way range, etc. | None |
| State Estimate Data | ID<br>Filter Output ID (that produced State Estimate)<br>Data<br>E.g., time, location in 3-dimensions, velocity in 3-dimensions, $c_d$, $c_R$, error covariance, etc. | None |
| Measurement Data | ID<br>Name<br>Measurement Type<br>E.g., GPS, 1-way range, 2-way range, 1-way range rate, 2-way range rate, Sequential range, Azimuth/elevation angles<br>Data | None |
| Earth Orientation Data | ID<br>Timestamp<br>Validity flag<br>E.g., set based on processing of recent, unvalidated data by flight dynamics tools (e.g., orekit) to ensure validity.<br>Data | ~1 month |
| Space Weather Data | ID<br>Timestamp<br>Validity flag<br>E.g., set based on processing of recent, unvalidated data by flight dynamics tools (e.g., orekit) to ensure validity.<br>Data | ~1 month |
| Force Model | ID<br>Name<br>Force Model Settings<br>E.g., spherical harmonics, solar radiation pressure, gravity, atmospheric drag, etc.<br>Tuning parameters related to force model<br>E.g., process additional noise | None |
| Measurement Model | ID<br>Name<br>Tuning parameters related to measurements<br>E.g., GPS sigma, GPS decay, 1-way range sigma, 1-way range decay, etc. | None |
| Satellite Model | ID<br>Name<br>Satellite parameters<br>E.g., satellite mass, $c_d$ for satellite, $c_R$ for satellite, etc.<br>Tuning parameters related to satellite model<br>E.g., $c_d$ sigma, $c_d$ decay, $c_R$ sigma, $c_R$ decay, etc.<br>Maneuver IDs | None |

TABLE 1-continued

Examples of notional resource types in orbit determination service.

| Resource Type | Attributes | Expiration |
|---|---|---|
| Maneuver Model | ID<br>Name<br>Maneuver specifics<br>E.g., change in velocity (dv), change in mass (dm) (for example, due to fuel consumption), time, etc.<br>Tuning parameters related to maneuver model<br>E.g., dv sigma, dm sigma, etc. | None |

The OD determination service 126 can employ a predictor-corrector methodology to prepare an OD for the requested satellite. For example, the OD determination service 126 takes a last-known best state for the requested satellite (e.g., provided by the requesting client, previously determined by the OD service 120 and stored in data storage service 128, or measured by the ground station 104 or a third-party system) and propagates the state forward in time using physics models stored in the data storage service 128. The resulting predicted OD has a certain uncertainty, which can be reduced by correcting the predicted OD using recent or real-time measurements of the satellite. For example, measurements can be retrieved for the OD service 120 via network 108 from various measurement sources 134 (e.g., other ground stations at different geographic locations, celestial observatories, radar installations, GPS tracking installations, etc.) or from third-party data repositories 136 (e.g., NORAD Space-Track, etc.).

In some embodiments, the model service 124 is configured to update or generate the physics models to improve the resulting OD. For example, the model service 124 can use data obtained from the determination of OD for multiple satellites to update a model, which updated model can then be globally applied for subsequent OD determination processes. For example, the updated model could be the model of Earth's atmosphere, whereby the update yields a more accurate assessment of the effect of Earth's atmosphere on the drag coefficient of satellites. This agglomeration of OD data thus allows the OD service 120 to achieve an accuracy for the resulting OD that would otherwise be unattainable by users 106a-106c calculating their OD independently. In effect, subsequent requests for OD determination (e.g., for satellite C by user 106c) can reap the benefit of improved accuracy by virtue of the model updated based on prior OD calculations (e.g., for satellite A by user 106a and/or for satellite B by user 106b).

In some embodiments, the model service 124 is further configured to determine physics models specific to the requested satellite. For example, the model service 124 can use data received from the user regarding a geometry or shape of the satellite. In some embodiments, the data regarding a geometry or shape of the satellite may be in the form of a computer-aided drawing (CAD) file or other digital representation or data of the satellite. In some embodiments, the model service 124 generates a model of solar radiation pressure by employing a ray tracing algorithm on the actual geometry or shape of the satellite, as indicated by the CAD file. Alternatively or additionally, the model service 124 generates a model of ballistic drag coefficient by employing computational fluid dynamics (CFD) analysis. In some embodiments, the model of ballistic drag coefficient for the satellite can be combined with the model of the effect of the Earth's atmosphere to yield further improvements in OD accuracy.

In some embodiments, user interface 122 can allow a user 106 to modify the OD provided by OD service 120. For example, a user may wish to ignore certain measurement data that is physically inconsistent with the state of the satellite and thus would degrade the accuracy of the OD if incorporated. Via user interface 122, the user can review and omit the measurement data applied to correct the predicted OD. Alternatively or additionally, the user can add or select measurement data via user interface 122 to be applied by the OD service 120 to further correct the predicted OD.

In some embodiments, OD service 120 can instantiate one or more session instances using virtualized compute resources of another service of a service provider network 110 that includes the ground station service 112. In some embodiments, the session instances may include a model modification instance, for example, to update a global model or generate a satellite-specific model for use in predicting OD, or a correction modification instance, for example, to update or determine a protocol for correcting predicted OD based on corrections manually applied by users in prior ODs. For example, a virtual compute instance can be implemented on one or more resource hosts included in a data center that comprises one or more servers with a specified computational capacity (e.g., indicated by the type and number of central processing units (CPUs), memory size, etc.) and a specified software stack (e.g., a particular version of an operating system, which may run on top of a hypervisor). In different embodiments, various computing devices can be employed alone or in combination to implement the compute instances of virtual compute services (e.g., ground station service 112 and/or OD service 120), including special purpose computer servers, storage devices, network devices, etc. In an exemplary embodiment, the OD service 120 can provide the user interface 122 as an API using, for example, AWS API Gateway, and can provide OD determination service 126 and/or model service 124 via a serverless computing platform such as AWS Lambda. Alternatively, physical computing resources can be used for session instances of the ground station service 112 and/or OD service 120 in place of or in addition to virtual compute resources.

Clients of service provider network 110 (e.g., users 106) and/or clients of OD service 112 (e.g., ground station service 112) encompass any type of client configurable to submit requests thereto. In some embodiments, clients include satellite owners/operators and/or other clients of a service provider network 110. For example, a client includes a suitable version of a web browser, a plug-in module or other type of code module configured to execute as an extension to or within an execution environment provided by a web browser, or any other type of web-enabled application.

Alternatively or additionally, a client encompasses an application, such as but not limited to, a database application (or user interface thereof), a media application, an office application, or any other application that employs compute instances of a compute service, or other network-based services in provider network 110 to perform various operations. In some embodiments, such an application may include sufficient protocol support (e.g., for Hypertext Transfer Protocol (HTTP)) to generate and process network-based service requests without otherwise requiring full browser support for all types of network-based data. In some embodiments, clients generate network-based service requests to either ground station service 112 or OD service 120 according to a Representational State Transfer (REST)-style network-based service architecture, a document- or message-based network-based service architecture, or another suitable network-based service architecture.

Figure 2:
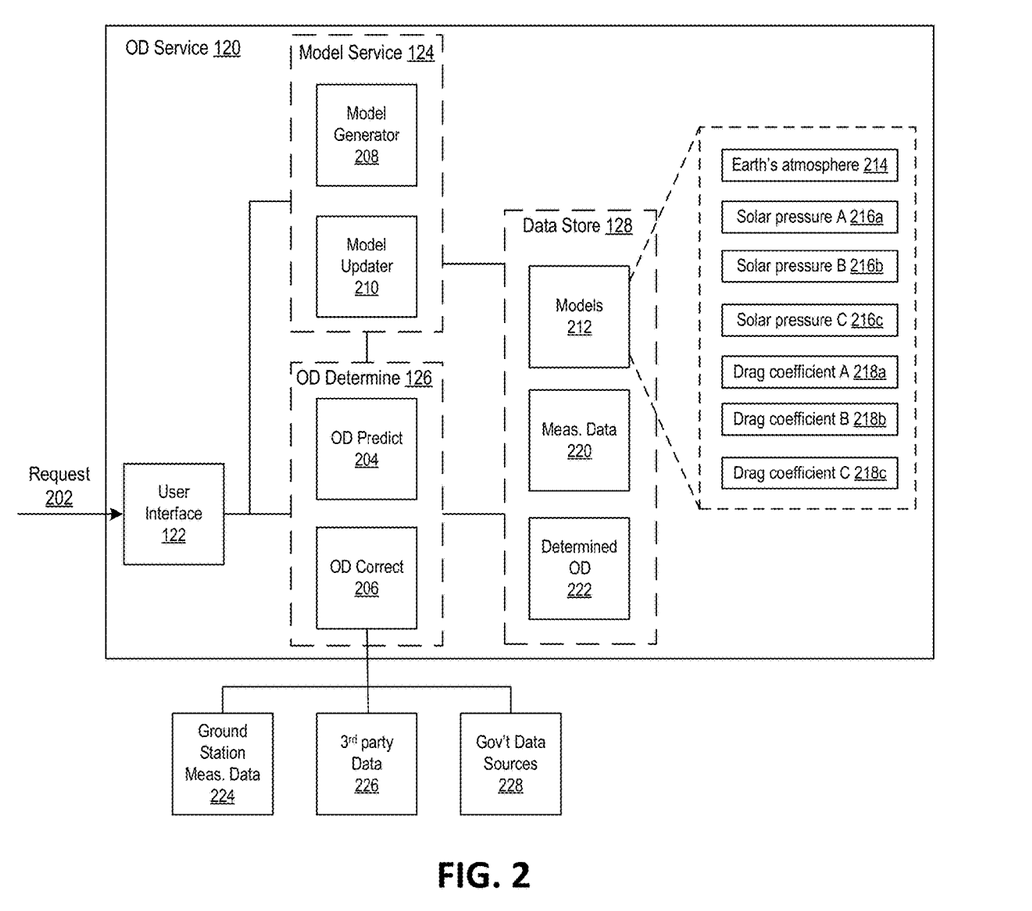
FIG. 2 is a schematic diagram illustrating aspects of an orbit determination service, according to one or more embodiments of the disclosed subject matter.

Referring to FIG. 2, further details of the OD service 120 are illustrated. The OD service 120 can receive a request 202 for OD at user interface 122. In embodiments, the request 202 can include any information that sufficiently identifies the satellite. For example, the request 202 can include a satellite identifier, such as a NORAD Catalog Number, NORAD ID, NASA catalog number, US SPACECOM object number, a catalog number and similar variants, a Committee on Space Research (COSPAR) number, etc. Alternatively or additionally, the request 202 can include measurement data of the satellite, such as point angles, ranging data, GPS telemetry, celestial image data, etc.

The OD determination service 126 can include an OD prediction service 204, which receives the satellite identification information from the user interface 122. The OD prediction service 204 can be configured to request and receive model resources 212 from data store 128 and to use the model resources 212 in predicting an OD for the satellite, for example, by propagating the last-known best state forward in time using the models. The OD prediction service 204 may further request and receive data of a last-known best state for the satellite from data store 128, or the request 202 may include the last-known best state which is forwarded from the user interface 122 to the OD prediction service 204. In some embodiments, the model resources 212 includes a globally optimized model (e.g., optimized based on prior OD determinations for a variety of satellites), such as model 214 of Earth's atmosphere, and a satellite specific model (e.g., optimized according to the particulars of the satellite), such as respective models 216a-216c for solar radiation pressure designed based on the specific geometries of satellites 106a-106c or respective models 218a-218c for drag coefficient designed based on the specific geometries of satellites 106a-106c.

In some embodiments, the OD determination service 126 can include an OD correction service 206, which can be configured to correct the predicted OD from the OD prediction service 204 based on measurement data (e.g., point angles, ranging data, GPS telemetry, celestial image data, etc.). The OD corrected by the OD correction service 206 can then be returned to the client via the user interface 122 and/or stored as data 222 in data store 128 for subsequent use (e.g., as a baseline for future OD calculations, for eventual orientation of an antenna of ground station 104, for use in global model optimizations, or for any other purpose).

For example, OD correction service 206 can receive recent measurement data 220 pertaining to the satellite from data store 128. Alternatively or additionally, OD correction service 206 can request and receive recent or real-time measurement data 224 of the satellite from a ground station, such as ground station 104. Alternatively or additionally, OD correction service 206 can request and receive recent or real-time measurement data 226 from third party measurement providers (e.g., celestial observatories, radar installations, GPS tracking installations, etc.) and/or recent or real-time measurement or tracking data 228 from governmental sources (e.g., International Earth Rotation and Reference Systems Service (IERS), National Oceanic and Atmospheric Administration (NOAA) National Environmental Satellite, Data, and Information Service (NESDIS), NORAD Space-Track, etc.). Alternatively or additionally, measurement data can be provided as part of the original request 202 from the client and provided to the OD correction service 206 by user interface 122.

In some embodiments, the model service 124 can include a model generation service 208, which can be configured to generate one or more models for use by the OD prediction service 204. For example, the model generation service 208 can receive specific data (e.g., CAD file) indicative of a shape or geometry of the satellite. In some embodiments, the data is provided as part of the initial request 202 and forwarded by user interface 122 for use by the model generation service 208. Alternatively or additionally, the data is provided to the OD service 120 as part of an initial setup or intake by the user. The model generation service 208 uses the specific data of the satellite to determine one or more models unique to the satellite and to store the models in data store 128. For example, models 216a-216c for solar radiation pressure unique to satellites 102a-102c, respectively, can be determined by model generation service 208 using ray tracing and stored for later use in model 212 of data store 128. In another example, models 218a-218c for ballistic drag coefficient unique to satellites 102a-102c, respectively, can be determined by model generation service 208 using CFD analysis and stored for later use in model 212 of data store 128.

Alternatively or additionally, model service 124 can include a model update service 210, which can be configured to update one or more models for use by the OD prediction service 204. In some embodiments, the model update service 210 can update a global model after each OD calculation by OD determination service 126, for example, to optimize the global model to minimize or reduce a difference between predicted OD from OD prediction service 204 and the final OD from OD corrected service 206. In some embodiments, the model update service 210 can periodically update the global model based on multiple prior OD calculations by OD determination service 126, for example, to optimize the global model to minimize or reduce differences between each predicted OD from OD prediction service and the corresponding final OD from OD corrected service 206. Other optimization techniques are also possible according to one or more contemplated embodiments. For example, the global model may be a model 214 of Earth's atmosphere that is similarly applied to the OD determination for each satellite and can be stored for later use in model 212 of data store 128.

Figure 3A:
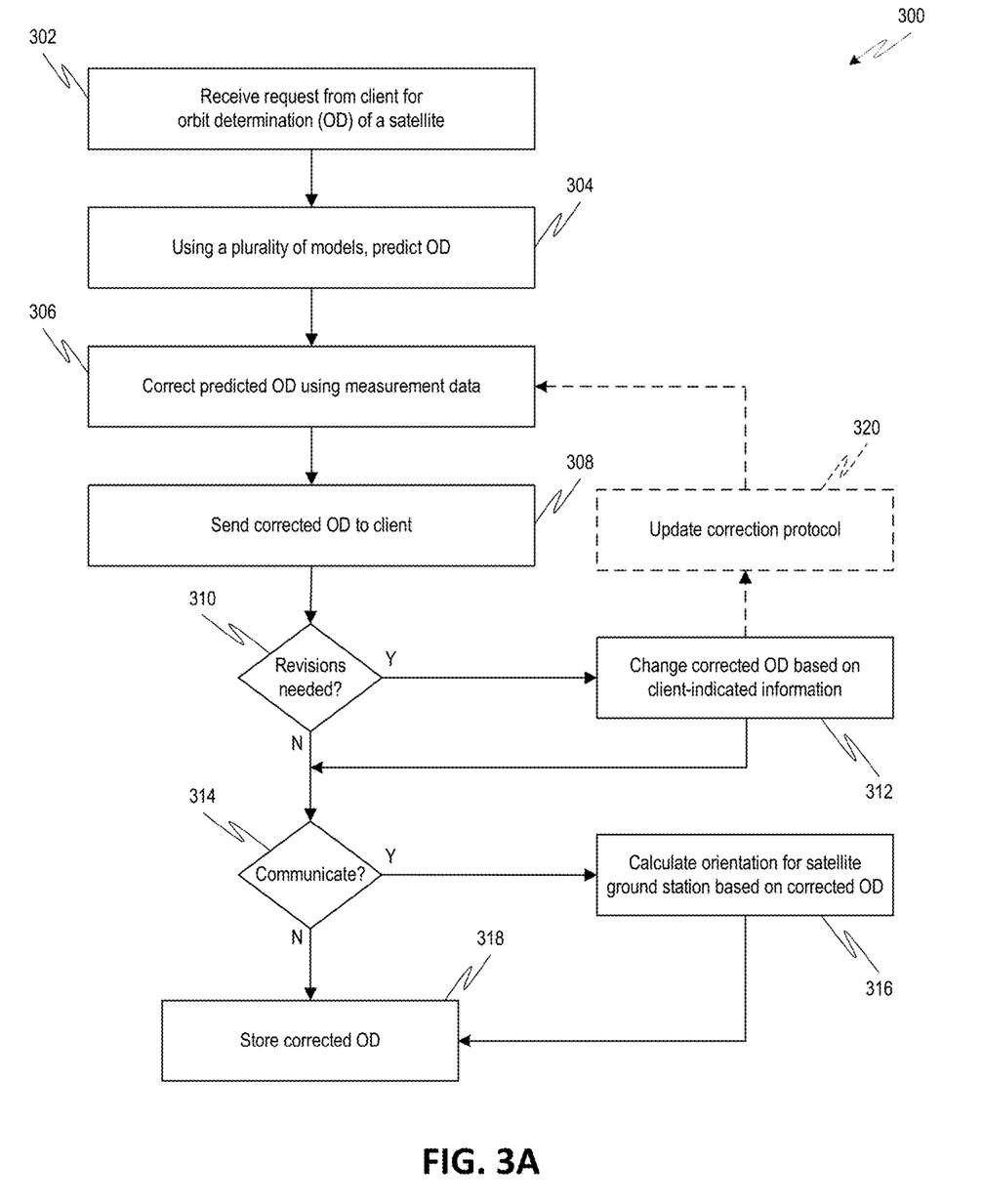
FIG. 3A is a process flow diagram of a satellite ground station service including orbit determination, according to one or more embodiments of the disclosed subject matter.

FIG. 3A illustrates a process flow diagram for an exemplary method 300 that may be performed, for example, by provider network 110. The method 300 can begin at 302, where a request is received from a client (e.g., one of the users 106a-106c, a program service operated by one of the users 106a-106c, or ground station service 112) to calculate OD for a satellite. The request from the client can include information that identifies the satellite, information regarding a last-known best state of the satellite, and/or measurement data of the satellite.

The method 300 can proceed to 304, where the OD for the satellite is predicted using a plurality of models, for example, by OD prediction service 204. For example, the OD can be predicted by propagating the last-known best state of the satellite forward in time using physics models. The predicted OD resulting from 304 may include a degree of uncertainty. The method 300 can then proceed to 306, where the predicted OD for the satellite is corrected using measurement data, for example, by OD correction service 206. For example, the measurement data can provide real-time or recent position and/or velocity information of the satellite, which information can be used to collapse the uncertainty (or at least reduce the uncertainty) in the predicted OD, thereby yielding a corrected OD for the satellite.

The method 300 can proceed to 308, where the corrected OD for the satellite can be communicated to the client, for example, via user interface 122. In some embodiments, the client may elect to correct the resulting OD manually. Thus, if it is determined that manual correction is required or desired at 310, the method 300 can proceed to 312, where the corrected OD can be further changed based on client-indicated information. For example, the client can provide additional measurement data at 312 for further correcting the OD generated by OD correction service 206, or can omit or ignore certain measurement data that may be physically inconsistent or otherwise incompatible with operation of the specific satellite. Otherwise, the method can proceed from 310 to 314.

In some embodiments, the manual user corrections and corresponding information of the scenario can be saved for use in subsequent OD calculations. For example, the method can optionally include updating a correction protocol at 320, which updated protocol can then be applied in correcting predicted OD at 306 in subsequent iterations of method 300 for the same or different satellites. The correction protocol may be revised such that corrections similar to those manually made by users can be automatically applied to predicted OD for satellites in scenarios (e.g., satellite type and geometry, satellite operation and dynamics, location, etc.) similar to those where users made manual corrections. Instead of automatically applying corrections, a user can be notified (e.g., by user interface 122 of OD service 120) of a need for corrective action similar to those corrections manually applied by users for satellites in similar scenarios.

In some embodiments, the updating the correction protocol 320 can include learning when and how to apply measurement data corrections based on the user manual corrections. For example, the data about manual corrections by the users and corresponding scenarios can serve as a training set for a machine learning service, which can operate as part of OD service 120, as a separate service on provider network 110, or as a separate service communicating with OD service 120 via network 108. The machine learning service can employ a learning algorithm to build an inference model based on the data, which inference model can be applied to future OD requests and scenarios to automatically apply corrections to predicted OD or to notify a user of applicable corrections to be applied manually. The learning algorithm can be any type of learning algorithm such as, but not limited to, supervised learning (e.g., classification algorithm), unsupervised learning (e.g., cluster analysis), reinforcement learning, self learning, feature learning, anomaly detection, inductive logic programming, etc. The inference model can be any type of machine learning model such as, but not limited to, artificial neural networks (e.g., deep learning neural network), decision tree, support vector machines (SVMs), regression analysis, Bayesian network, genetic algorithm, etc.

In some embodiments, the corrected OD can be used by a ground station service to orient an antenna of a ground station for communication with the satellite. Thus, if it is determined that communication is required or desired at 314, the method 300 can proceed to 316, where the corrected OD is used to calculate an orientation of the satellite ground station with respect to the satellite, for example, by orientation information service 114. For example, the OD for the satellite can be converted into ephemeris, which in turn can be translated into point angles of the antenna of the satellite ground station. Once properly oriented, the ground station and the satellite can proceed to communicate with each other, Otherwise, the method 300 can proceed to 318, where the corrected OD is stored for later use, for example, for scheduling future communication between the ground station and the satellite.

Figure 3B:
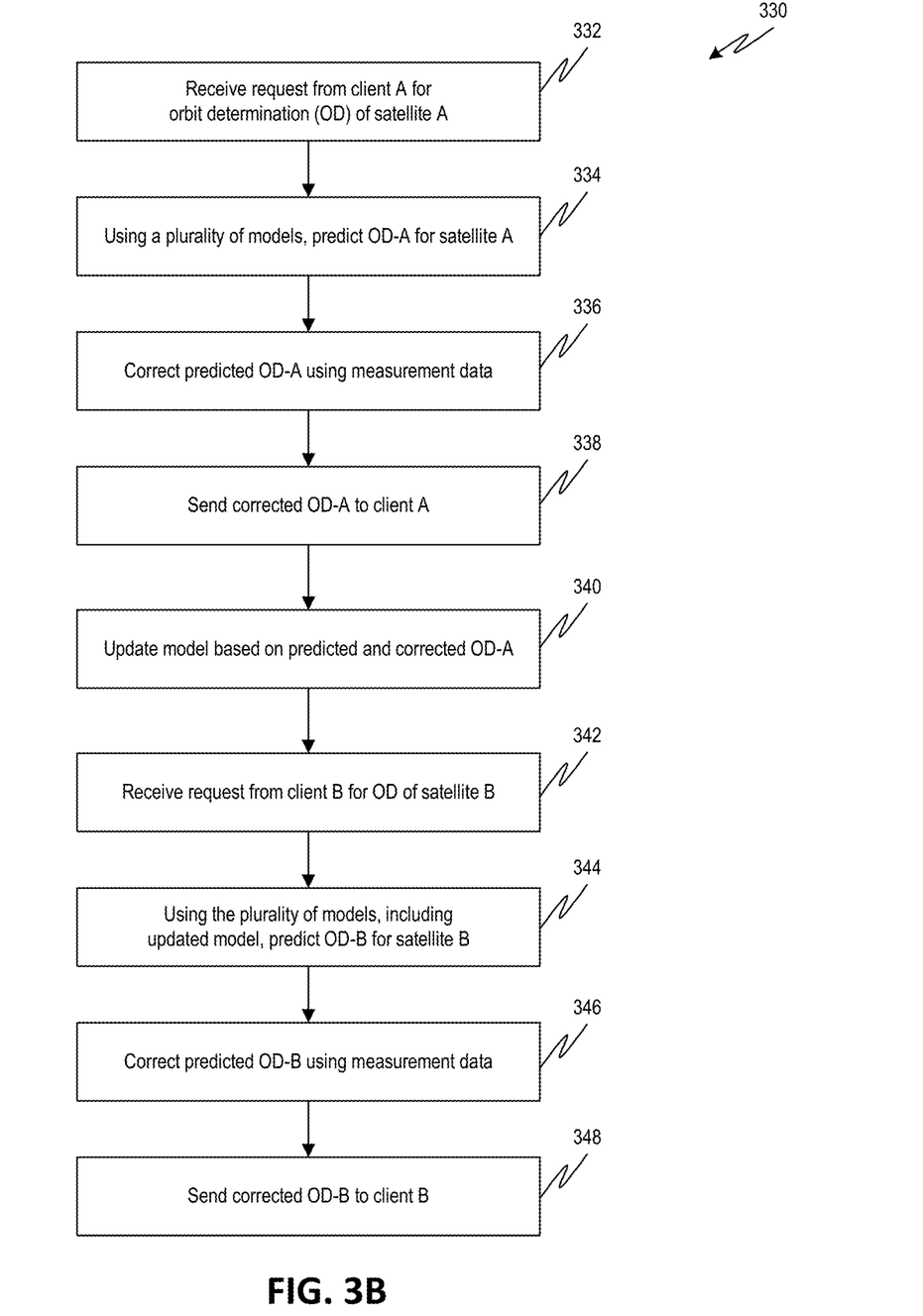
FIG. 3B is a process flow diagram of an orbit determination service including model updates, according to one or more embodiments of the disclosed subject matter.

FIG. 3B illustrates a process flow diagram for an exemplary method 330 that may be performed, for example, by OD service 120. The method 330 can begin at 332, where a request is received from client A (e.g., user 106a, a program service operated by user 106a, or ground station service 112 in response to a request by user 106a) to determine OD for satellite A (e.g., satellite 102a). The request can include information that specifically identifies satellite A, information regarding a last-known best state of satellite A, and/or measurement data of satellite A.

The method 330 can proceed to 334, where the OD for satellite A is predicted using a plurality of models, for example, by OD prediction service 204. For example, the OD can be predicted by propagating the last-known best state of satellite A forward in time using physics models. The predicted OD resulting from 334 may include a degree of uncertainty. The method 330 can then proceed to 336, where the predicted OD for satellite A is corrected using measurement data, for example, by OD correction service 206. For example, the measurement data can provide real-time or recent position and/or velocity information of satellite A, which information can be used to collapse the uncertainty (or at least reduce the uncertainty) in the predicted OD, thereby yielding a corrected OD for satellite A.

The method 330 can proceed to 338, where the corrected OD for satellite A can be communicated to client A, for example, via user interface 122. The method 330 can then proceed to 340, where one of the physics models can be updated or optimized based on the predicted OD and corrected OD for satellite A. In some embodiments, the updating of the physics model at 340 may be based just on the predicted OD and corrected OD for satellite A, e.g., an incremental adjustment to the physics model to eliminate or at least reduce a difference between the predicted OD at 334 and the corrected OD at 336 for satellite A. Alternatively or additionally, the updating of the physics model at 340 may be based on the predicted OD and corrected OD from multiple prior OD calculations for different satellites, including that for satellite A at 334 and 336. In such embodiments, the updating of the physics model may occur periodically and can seek to obtain an optimal fit for the multiple data points from the prior OD determinations. For example, the physics model updated at 340 can be a model for Earth's atmosphere used in the determination of drag coefficient for the satellite.

The method 330 can proceed to 342, where a request is received from client B (e.g., user 106b, a program service operated by user 106*b*, or ground station service 112 in response to a request by user 106*b*) to determine OD for satellite B (e.g., 102*b*). The request can include information that specifically identifies satellite B, information regarding a last-known best state of satellite B, and/or measurement data of satellite B.

The method 330 can proceed to 344, where the OD for satellite B is predicted using a plurality of models, for example, by OD prediction service 204. However, 344 employs the physics model updated at 340. Thus, information acquired in the OD calculation of satellite A for user A can be used to improve the OD calculation of a different satellite B for a different user B. For example, the OD can be predicted by propagating the last-known best state of satellite B forward in time using physics models. The predicted OD resulting from 344 may include a degree of uncertainty. The method 330 can then proceed to 346, where the predicted OD for satellite B is corrected using measurement data, for example, by OD correction service 206. For example, the measurement data can provide real-time or recent position and/or velocity information of satellite B, which information can be used to collapse the uncertainty (or at least reduce the uncertainty) in the predicted OD, thereby yielding a corrected OD for satellite B. The method 330 can proceed to 348, where the corrected OD for satellite B can be communicated to client B, for example, via user interface 122.

For example, to update the model for the Earth's atmosphere, the OD service 120 can use data from multiple satellites. Each satellite can have their drag coefficient well characterized, for example, by analysis of a CAD file or other data indicative of the shape of the satellite. The OD service 120 may also have access to high-accuracy measurement data for each satellite, for example, measurement data from GPS receivers aboard the satellites. When OD service 120 calculates OD for a first of the satellites, the correction of the predicted OD based on the high-accuracy measurement data may indicate a discrepancy between the drag predicted by the model for Earth's atmosphere and the apparent actual drag experienced by the first satellite. The OD service 120 may thus locally update the model along a trajectory through Earth's atmosphere travelled by the first satellite (or along a 3-D slice of Earth's atmosphere containing the satellite trajectory). For example, the OD service 120 may locally update the model to minimize or at least reduce the discrepancy in drag for the first satellite (e.g., such that the value of the predicted drag approaches the value of the apparent actual drag experienced by the first satellite as suggested by the measurement data). Alternatively or additionally, the OD service 120 may locally update the model to minimize or at least reduce the discrepancy in state for the first satellite (e.g., by applying a correction to the predicted drag from the model such that the predicted state approaches the apparent actual state of the first satellite as suggested by the measurement data).

Similarly, data from OD calculations for satellites traveling through other regions of Earth's atmosphere can be used by OD service 120 to locally update the model at those locations. For example, the OD service 120 can generate a 3-D mesh map corresponding to Earth's atmosphere, with a correction factor at each mesh point. The correction factor can correspond to a difference between drag predicted by the uncorrected nominal model for Earth's atmosphere and actual drag experienced by a satellite moving through the mesh point. The mesh map can then be applied to determine appropriate corrections in subsequent OD predictions for the same or different satellites traveling through one or more of the mesh points. In some embodiments, the update to the model may be transient, for example, to account for changes in Earth's atmosphere over time. For example, the correction factor applied in the mesh map may be configured to linearly or exponentially decay over time (e.g., having a half-life of 1 day) back to the uncorrected nominal model.

In some embodiments, the model of Earth's atmosphere may be updated at multiple locations simultaneously using prior calculated ODs and measurement data from multiple satellites over a predetermined time period. In such embodiments, the update at each mesh point may be similar to that described above for an individual satellite. In some cases, multiple satellites may have passed through the same mesh point over the time period (e.g., 7 days), and the OD service 120 can combine data from all of the satellites passing through the mesh point to determine an appropriate correction factor for that mesh point. For example, the correction factor for a particular mesh point may be chosen to minimize the difference between predicted drag and actual drag for each of the satellites that have passed through that mesh point. Alternatively or additionally, updates to the model can combine data from multiple satellites by weighting based on time, with more recent OD calculations and measurement data awarded higher weights. The resulting mesh of correction factors can then be used to improve subsequent OD predictions by OD service 120.

Figure 3C:
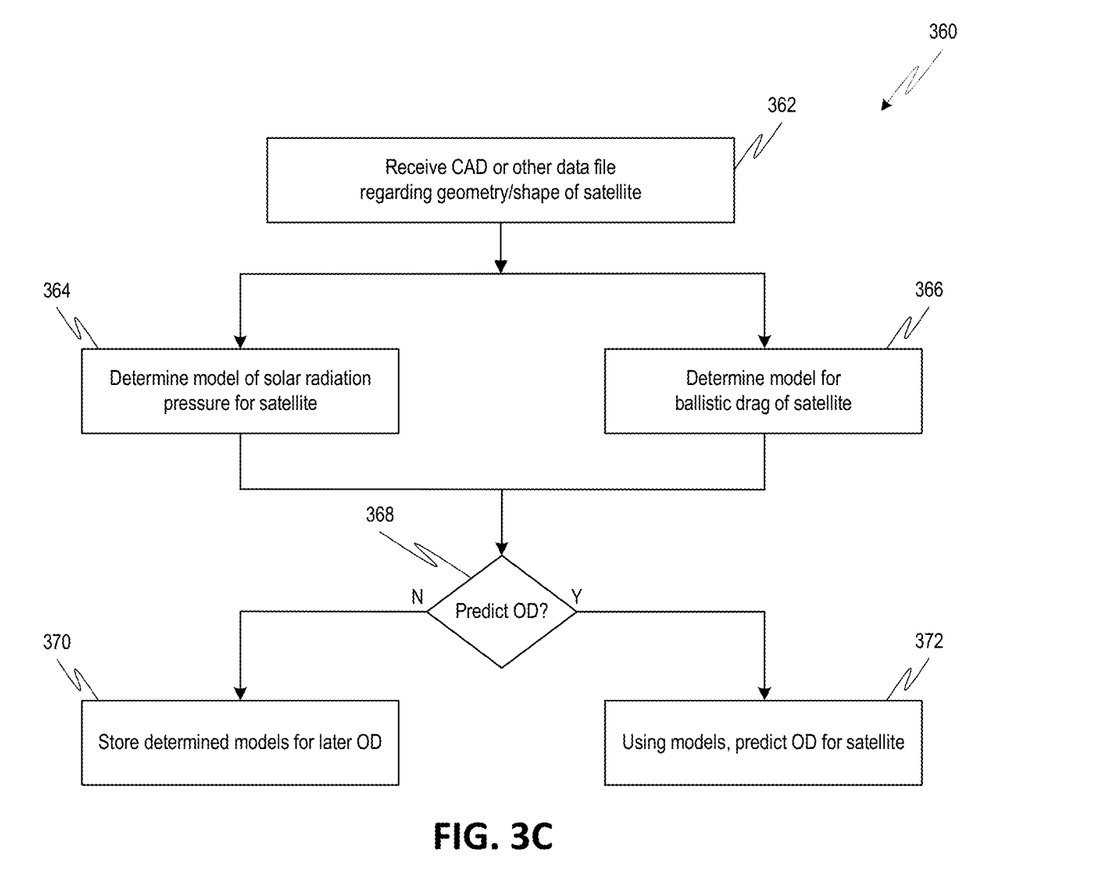
FIG. 3C is a process flow diagram of satellite-specific model generation of the orbit determination service, according to one or more embodiments of the disclosed subject matter.

FIG. 3C illustrates a process flow diagram for an exemplary method 360 that may be performed, for example, by model generation service 208. The method 360 can begin at 362, where a CAD file or other data file is received regarding a geometry or shape of a satellite. For example, the CAD file or other data file can be provided by a client (e.g., user 106*a*) as part of an initial intake or setup with OD service 120, but not otherwise resubmitted with subsequent OD requests since the structure of the satellite should not change over time. Alternatively or additionally, the CAD file or other data file can be provided by the client as part of a request for OD of the satellite.

The method 360 can proceed to 364, where a model of solar radiation pressure is determined for the satellite, and/or to 366, where a model of ballistic drag coefficient is determined for the satellite. For example, the model of solar radiation pressure can be determined by employing a ray tracing technique to a three-dimensional model of the satellite from the CAD file, and the model of ballistic drag coefficient can be determined by employing a CFD analysis to the three-dimensional mode of the satellite from the CAD file.

The method can proceed to 368, where it is determined if a prediction of OD for the satellite has been requested (e.g., as part of request received at 302 in FIG. 3A or as part of request received at 332 in FIG. 3B). If OD prediction has not yet been requested at 368, the determined models specific for the satellite can be stored at 370 for subsequent use in predicting OD when requested (e.g., as models used in the prediction at 304 in FIG. 3A or as models used in the prediction at 334 and in the prediction at 344 in FIG. 3B). If it is otherwise determined at 368 that OD prediction has already been requested, the process can proceed to predict OD, for example, as discussed with respect to methods 300 or 332.

Although illustrated separately in FIGS. 3A-3C and discussed separately above, the methods 300, 330, and 360 may instead be combined together as a common process in some embodiments. For example, the receiving of client request 302 in method 300, the receiving of client request 332 in method 330, and the receiving of CAD file 362 in method 360 may also constitute a single common request. In another example, the updating of the model 340 may be provided after correction of predicted OD 306 in method 300 of FIG. 3A, and steps 362-372 of method 360 may precede the receiving of client request 302 in method 300 of FIG. 3A. Moreover, the illustrated methods 300, 330, 360 can be repeated for additional satellites (e.g., satellite C 102c), additional clients or users (e.g., user C 106c), and/or additional ground stations beyond those specifically discussed in the description of FIGS. 3A-3C.

Figure 4:
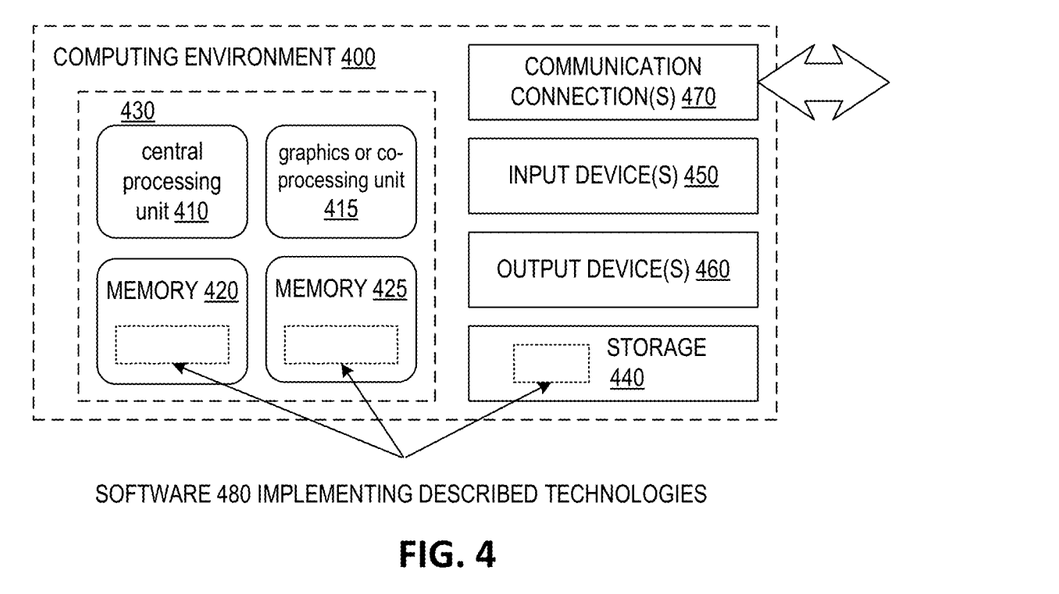
FIG. 4 depicts a generalized example of a suitable computing environment in which the described innovations may be implemented.

FIG. 4 depicts a generalized example of a suitable computing environment 400 in which the described innovations may be implemented. The computing environment 400 is not intended to suggest any limitation as to scope of use or functionality, as the innovations may be implemented in diverse general-purpose or special-purpose computing systems. For example, the computing environment 400 can be any of a variety of computing devices (e.g., desktop computer, laptop computer, server computer, tablet computer, etc.).

The computing environment 400 includes one or more processing units 410, 415 and memory 420, 425. In FIG. 4, this basic configuration 430 is included within a dashed line. The processing units 410, 415 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 4 shows a central processing unit 410 as well as a graphics processing unit or co-processing unit 415. The tangible memory 420, 425 may be volatile memory (e.g., registers, cache, RAM), non-volatile memory (e.g., ROM, EEPROM, flash memory, etc.), or some combination of the two, accessible by the processing unit(s). The memory 420, 425 stores software 480 implementing one or more innovations described herein, in the form of computer-executable instructions suitable for execution by the processing unit(s).

A computing system may have additional features. For example, the computing environment 400 includes storage 440, one or more input devices 450, one or more output devices 460, and one or more communication connections 470. An interconnection mechanism (not shown) such as a bus, controller, or network interconnects the components of the computing environment 400. Typically, operating system software (not shown) provides an operating environment for other software executing in the computing environment 400, and coordinates activities of the components of the computing environment 400.

The tangible storage 440 may be removable or non-removable, and includes magnetic disks, magnetic tapes or cassettes, CD-ROMs, DVDs, or any other medium which can be used to store information in a non-transitory way, and which can be accessed within the computing environment 400. The storage 440 stores instructions for the software 480 implementing one or more innovations described herein.

The input device(s) 450 may be a touch input device such as a keyboard, mouse, pen, or trackball, a voice input device, a scanning device, or another device that provides input to the computing environment 400. The output device(s) 460 may be a display, printer, speaker, CD-writer, or another device that provides output from computing environment 400.

The communication connection(s) 470 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C++, Java, Perl, any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A computer-implemented method comprising:
   receiving, from a first client, a first request for orbit determination for a first spacecraft, the first request including data identifying the first spacecraft;
   using a plurality of predetermined models, calculating a predicted orbit for the first spacecraft;
   based on spacecraft data corresponding to the first spacecraft, correcting the predicted orbit for the first spacecraft to yield a first orbit determination for the first spacecraft and sending the first orbit determination to the first client;
   updating a first model of the plurality of predetermined models based on the predicted orbit and the first orbit determination for the first spacecraft;
   receiving, from a second client, a second request for orbit determination for a second spacecraft, the second request including data identifying the second spacecraft;
   using the plurality of predetermined models including the updated first model, calculating a predicted orbit for the second spacecraft; and
   based on spacecraft data corresponding to the second spacecraft, correcting the predicted orbit for the second spacecraft to yield a second orbit determination for the second spacecraft and sending the second orbit determination to the second client.

2. The computer-implemented method of claim 1, wherein the spacecraft is a satellite.

3. The computer-implemented method of claim 1, further comprising updating the first model or a second model of the plurality of predetermined models based, at least in part, on the predicted orbit for the second spacecraft and on the second orbit determination for the second spacecraft.

4. The computer-implemented method of claim 1, wherein the first model is a model of Earth's atmosphere for determining drag on a spacecraft.

5. The computer-implemented method of claim 1, wherein the updating is based, at least in part, on multiple prior predicted orbits and corrections for other spacecraft in addition to the first spacecraft.

6. The computer-implemented method of claim 1, further comprising, prior to the calculating the predicted orbit for the first spacecraft, generating a model of solar radiation pressure for the first spacecraft or a model of ballistic drag for the first spacecraft based on a computer-aided drawing (CAD) data file for the first spacecraft or other data file indicating a geometric shape of the first spacecraft.

7. A spacecraft service comprising:
   a ground station having an antenna for scheduling communication with a spacecraft;
   one or more computing devices for receiving a request for scheduling communication with the spacecraft and controlling an orientation of the antenna to communicate with the spacecraft, the one or more computing devices being configured to:
      calculate a predicted orbit of the spacecraft using a plurality of models;
      correct the predicted orbit using spacecraft data corresponding to the spacecraft to yield a first orbit determination for the spacecraft; and
      determine the orientation of the antenna based, at least in part, on the first orbit determination.

8. The spacecraft service of claim 7, wherein:
   the one or more computing devices are configured to implement a web-based graphical user interface to receive the request for scheduling communication with the spacecraft, or
   the one or more computing devices are configured to implement an application programming interface (API) to receive the request for scheduling communication with the spacecraft or to receive a request for orbit determination of the spacecraft.

9. The spacecraft service of claim 7, wherein the one or more computing devices are further configured to:
   update a first model of the plurality of models based, at least in part, on the predicted orbit and corrected first orbit determination,
   wherein the first model is a model of Earth's atmosphere for determining drag on a spacecraft.

10. The spacecraft service of claim 7, wherein the one or more computing devices are further configured to:
    receive a computer-aided drawing (CAD) file of the spacecraft or other data providing a geometric representation of the spacecraft; and
    based on the CAD file or other data providing the geometric representation, generate a model of solar radiation pressure for the spacecraft using ray tracing or generating a model of ballistic drag for the spacecraft using computational fluid dynamics.

11. The spacecraft service of claim 7, wherein, to correct the predicted orbit, the one or more computing devices are further configured to ignore respective spacecraft data of the spacecraft data corresponding to the spacecraft that is physically inconsistent with the predicted orbit.

12. A method comprising:
    providing, to multiple clients, a user interface to a spacecraft orbit determination service;
    receiving via the user interface a first request for orbit determination for a first spacecraft;
    determining via the spacecraft orbit determination service a first orbit determination for the first spacecraft, and returning the first orbit determination via the user interface;
    receiving via the user interface a second request for orbit determination for a second spacecraft; and
    determining via the spacecraft orbit determination service a second orbit determination for the second spacecraft and returning the second orbit determination via the user interface.

13. The method of claim 12, wherein the spacecraft orbit determination service is integrated into a provider network of cloud-computing services.

14. The method of claim 12, wherein the multiple clients include a ground station, and the method further comprises:
   calculating orientation of an antenna of the ground station to communicate with the first spacecraft; and
   positioning the antenna according to the calculated orientation.

15. The method of claim 12, wherein the first request is from an owner or operator of the first spacecraft, and the second request is from an owner or operator of the second spacecraft that is different from that of the first spacecraft.

16. The method of claim 12, wherein:
   the receiving the first request includes receiving spacecraft data, corresponding to the first spacecraft, from a first client; and
   the determining the first orbit determination includes correcting a predicted orbit for the first spacecraft using the spacecraft data received from the first client.

17. The method of claim 12, wherein:
   the spacecraft orbit determination service employs at least a first model in determining the first orbit determination for the first spacecraft;
   the method further comprises updating the first model based on the determined first orbit determination; and
   the spacecraft orbit determination service employs at least the updated first model in determining the second orbit determination for the second spacecraft.

18. The method of claim 17, wherein the first model is a model of Earth's atmosphere for determining drag on a spacecraft.

19. The method of claim 17, further comprising:
   receiving, via the user interface, a computer-aided drawing (CAD) file or other data providing a geometric representation of the first spacecraft; and
   based on the CAD file or other data providing the geometric representation, generating a second model of solar radiation pressure for the first spacecraft using ray tracing and generating a third model of ballistic drag for the first spacecraft using computational fluid dynamics,
   wherein the spacecraft orbit determination service employs at least the first through third models in determining the first orbit determination for the first spacecraft.

20. The method of claim 19, wherein the receiving the CAD file or other data is part of the receiving the first request.

* * * * *